(12) United States Patent
Salimath et al.

(10) Patent No.: US 11,800,647 B1
(45) Date of Patent: Oct. 24, 2023

(54) SYSTEM AND METHOD FOR SKYRMION BASED LOGIC DEVICE (71) Applicant: Ceremorphic, Inc., San Jose, CA (US)

(72) Inventors: Akshaykumar Salimath, Hyderabad (IN); Sanghamitra Debroy, Hyderabad (IN); Venkat Mattela, San Jose, CA (US)

(73) Assignee: Ceremorphic, Inc., San Jose, CA (US)

( * ) Notice: Subject to any disclaimer, the term of this patent is extended or adjusted under 35 U.S.C. 154(b) by 0 days.

(21) Appl. No.: 17/734,058

(22) Filed: Apr. 30, 2022

(51) Int. Cl.
H05K 1/02 (2006.01)
H05K 3/10 (2006.01)

(52) U.S. Cl.
CPC ............ H05K 3/10 (2013.01); H05K 1/0296 (2013.01); H05K 2201/09236 (2013.01); H05K 2201/09245 (2013.01)

(58) Field of Classification Search
CPC ....... H05K 1/0296; H05K 1/0298; H05K 3/10
See application file for complete search history.

(56) References Cited

U.S. PATENT DOCUMENTS 5,781,239 A * 7/1998 Mattela .................. G06T 9/007
708/401
2022/0366955 A1* 11/2022 Wang ..................... H10N 50/85

* cited by examiner

Primary Examiner — Jeremy C Norris
(74) Attorney, Agent, or Firm — Minisandram Law Firm; Raghunath S. Minisandram (57) ABSTRACT A system and method for a logic device is disclosed. A plurality of nanotracks are disposed over a substrate, along a first axis, with at least a left nanotrack, a right nanotrack and a middle nanotrack disposed between the left nanotrack and the right nanotrack. At least one connector nanotrack is disposed to connect two adjacent nanotracks. An input value is defined at a first end of the plurality of nanotracks by selectively nucleating a skyrmion at the first end. Presence of the skyrmion is indicative of a first value and absence of the skyrmion indictive of a second value. The nucleated skyrmion moves towards the second end of the nanotrack when a charge current is passed along the first axis. The presence of the skyrmion sensed at the second end of the middle nanotrack indicates an output value of the first value.

18 Claims, 6 Drawing Sheets

FIGURE 1

|   | INPUT A | INPUT B | INPUT C | OUTPUT |
|---|---|---|---|---|
| 218 | 0 | 0 | 0 | 0 |
| 220 | 0 | 0 | 1 | 0 |
| 222 | 0 | 1 | 0 | 0 |
| 212 | 0 | 1 | 1 | 1 |
| 224 | 1 | 0 | 0 | 0 |
| 214 | 1 | 0 | 1 | 1 |
| 216 | 1 | 1 | 0 | 1 |
| 210 | 1 | 1 | 1 | 1 |

SYSTEM AND METHOD FOR SKYRMION BASED LOGIC DEVICE

RELATED APPLICATION

None

TECHNICAL FIELD

The present invention relates generally to logic devices and more specifically, to skyrmion based logic devices.

DESCRIPTION OF RELATED ART

The rapid development of information technology has ensured a continuous increase of the logic density over the past years. As the VLSI technology and associated CMOS based logic devices reach their limits, further increase in logic device density capacity can only be accomplished through novel approaches.

Further, continued requirement for minimal power consumption in computing devices configured to use these devices and utilization of semiconductor technology to construct these devices are desirable for mass adaptation of these devices. With these needs in mind, the current disclosure arises. This brief summary has been provided so that the nature of the disclosure may be understood quickly. A more complete understanding of the disclosure can be obtained by reference to the following detailed description of the various embodiments thereof in connection with the attached drawings.

SUMMARY OF THE INVENTION

In one embodiment, a method is disclosed. A substrate is provided. A plurality of nanotracks are disposed along a first axis, with at least a left nanotrack, a right nanotrack and a middle nanotrack over the substrate. The middle nanotrack disposed between the left nanotrack and the right nanotrack. Each nanotrack have a first end and a second end. At least one connector nanotrack is disposed to selectively connect two adjacent nanotracks. An input value is defined at the first end of the plurality of nanotracks by selectively nucleating a skyrmion at first end of one or more of the nanotracks. Presence of the skyrmion is indicative of a first value and absence of the skyrmion indictive of a second value. A charge current is selectively passed through the substrate to selectively move the nucleated skyrmion towards the second end of the one or more nanotrack. The charge current is passed along the first axis. The presence of the skyrmion is sensed about the second end of the middle nanotrack. An output value is concluded as the first value when the presence of the skyrmion is sensed.

In another embodiment, a system is disclosed. A substrate is provided. A plurality of nanotracks are disposed along a first axis, with at least a left nanotrack, a right nanotrack and a middle nanotrack over the substrate. The middle nanotrack disposed between the left nanotrack and the right nanotrack. Each nanotrack have a first end and a second end. At least one connector nanotrack is disposed to selectively connect two adjacent nanotracks. An input value is defined at the first end of the plurality of nanotracks by selectively nucleating a skyrmion at first end of one or more of the nanotracks. Presence of the skyrmion is indicative of a first value and absence of the skyrmion indictive of a second value. A charge current is selectively passed through the substrate to selectively move the nucleated skyrmion towards the second end of the one or more nanotrack. The charge current is passed along the first axis. The presence of the skyrmion is sensed about the second end of the middle nanotrack. An output value is concluded as the first value when the presence of the skyrmion is sensed.

This brief summary is provided so that the nature of the disclosure may be understood quickly. A more complete understanding of the disclosure can be obtained by reference to the following detailed description of the preferred embodiments thereof in connection with the attached drawings.

BRIEF DESCRIPTION OF THE DRAWINGS

The foregoing and other features of several embodiments are described with reference to the drawings. In the drawings, the same components have the same reference numerals. The illustrated embodiments are intended to illustrate but not limit the invention. The drawings include the following figures.

DETAILED DESCRIPTION

To facilitate an understanding of the adaptive aspects of the present disclosure, an example logic device will be described. The specific construction and operation of the adaptive aspects of various elements of the example logic device is described.

Figure 1:
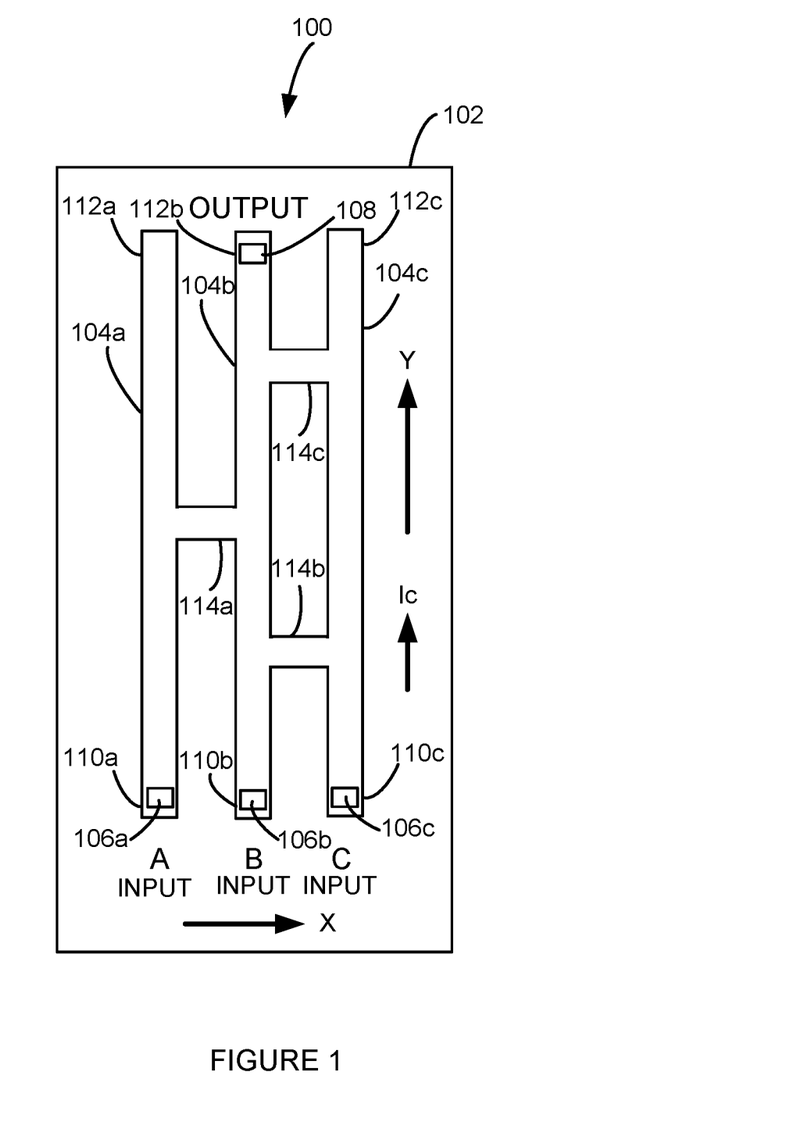
FIG. 1 shows an example logic device, according to one aspect of the present disclosure.

FIG. 1 shows an example logic device 100. The logic device 100 includes a substrate 102, a plurality of nanotracks 104a, 104b, and 104c, a plurality of nucleating devices 106a, 106b, and 106c, and a sense device 108. The substrate 102 is a conductive metal layer. The substrate 102 is substantially made of heavy metal, such as Tantalum (Ta), Platinum (Pt), or Tungsten (W) or an alloy of heavy metal. In one example, the substrate 102 is a layer of thin film with a very large spin hall angle, such as a layer of thin film of Tantalum (Ta), Platinum (Pt), or Tungsten (W) or an alloy of Tantalum (Ta), Platinum (Pt), or Tungsten (W). The substrate 102 is configured to receive a charge current and convert the charge current into a spin current, through spin Hall effect. The thickness of the substrate 102 may be of the order of about 5 nm to about 10 nm. As one skilled in the art appreciates, the substrate 102 may be deposited on a base layer (not shown). In some examples, base layer may be a silicon wafer.

The plurality of nanotracks 104a, 104b, and 104c are disposed over the substrate. The plurality of nanotracks 104a, 104b, and 104c are composed of ferromagnetic material. In some examples, a suitable cobalt-nickel alloy or other similar materials (for example, nickel iron alloy, or cobalt, iron, nickel alloys) that provide high magnetic permeability may be used. In one example, the plurality of nanotracks 104a, 104b, and 104c are substantially rectangular in shape and are disposed substantially parallel to each other, along an axis Y. Each nanotrack has a first end and a second end. For example, nanotrack 104a has a first end 110a and a second end 112a. The nanotrack 104b has a first end 110b and a second end 112b. The nanotrack 104c has a first end 110c and a second end 112c. Nanotrack 104b is disposed between the nanotrack 104a and 104c. Sometimes nanotrack 104a is referred to as left nanotrack 104a, nanotrack 104b is referred to as middle nanotrack 104b, and nanotrack 104c is referred to as right nanotrack 104c. In one example, a width of the plurality of nanotracks 104a, 104b, and 104c is about 80 nanometers. Further, a space between two adjacent nanotracks is about 5-10 nanometers. In one example, a thickness of the nanotrack is about 1 nanometer.

A plurality of connector nanotracks 114a, 114b, and 114c are selectively disposed between two adjacent nanotracks. For example, connector nanotrack 114a (sometimes referred to as middle connector nanotrack 114a) is disposed between the left nanotrack 104a and middle nanotrack 104b. Connector nanotrack 114b (sometimes referred to as lower middle nanotrack 114b) is disposed between the middle nanotrack 104a and right nanotrack 104c below the middle connector nanotrack 114a. Connector nanotrack 114c (sometimes referred to as upper middle nanotrack 114c) is disposed between the middle nanotrack 104a and right nanotrack 104c above the middle connector nanotrack 114a. As previously described, space between two adjacent nanotracks is of the order of about 5-10 nanometers. The space between two adjacent nanotracks results in a length of the connector nanotracks in the order of about 5-10 nanometers. In one example, the width of connector nanotracks is of the order of about 80 nanometers.

Nucleating devices 106a, 106b, and 106c are disposed about the first end of the nanotracks 104a, 104b, and 104c respectively. For example, nucleating device 106a is disposed about the first end 110a of the left nanotrack 104a. Nucleating device 106b is disposed about the first end 110b of the middle nanotrack 104b. Nucleating device 106c is disposed about the first end 110c of the right nanotrack 104c. In one example, the nucleating devices are magnetic tunnel junction devices. By selectively passing current through the nucleating devices, a skyrmion is nucleated about the first end of the nanotrack. In one example, presence of the skyrmion is indicative of a first value, for example, a value of 1 and absence of the skyrmion is indicative of a second value, for example, a value of 0. In this example, the nucleating device 106a sets the input value for input A, nucleating device 106b sets the input value for input B, and nucleating device 106c sets the input value for input C.

Skyrmions are topologically protected magnetic configurations observed in magnets lacking inversion symmetry. Their topological protection comes from nonzero winding number. This result in their robustness against thermal fluctuations and disorder. Magnetic skyrmions are technologically intriguing due to their small size (typically less than 10 nm), ultra low currents required for their manipulation, for example, selective movement inside the nanotracks. They have large annihilation energy barrier (annihilation energy $Ea > 50 k_B T$ where $k_B$ is Boltzmann constant and T is temperature. This large annihilation energy barrier can result in lifetimes greater than 10 years, generally suitable for device applications.

Skyrmions are stabilized by the presence of Dzyaloshinskii-Moriya interactions (DMIs) observed in chiral magnets or at the ferromagnet/heavy metal layer (FM-HM layer) interface. The interfacial spin orbit interaction give rise to DMI interaction at the FM-HM layer interface and is responsible for the stabilization of skyrmion bits in the ferromagnet. The same interfacial spin orbit interaction is responsible for spin Hall effect in the heavy metal layer. Further, the proposed design the skyrmions are confined to the ferromagnet nanotracks due to edge repulsion. The skyrmion bits are nucleated by passing current through the magnetic tunnel junction positioned at each of the input nodes. The skyrmions are propagated through the spin orbit torque resulting from the x-polarized electrons accumulated at the ferromagnet/heavy metal layer interface when the charge current flows in the y-direction in the heavy metal layer.

In general, magnetic skyrmion is a stable nano sized spin configurations with topological property that is locally nucleated by injection of spin-polarized current and displaced in the ferromagnet nanotrack by current-induced spin torques.

The sense device 108 is selectively disposed about the second end 112b of the middle nanotrack 104b. The sense device 108 is configured to sense the presence of the skyrmion about the second end of the middle nanotrack 104b. In one example, presence of the skyrmion is indicative of a first value, for example, a value of 1 and absence of the skyrmion is indicative of a second value, for example, a value of 0. In some examples, the sense device 108 is a magnetic tunnel junction device.

When a charge current Ic is passed through the substrate 102, nucleated skyrmions are configured to travel towards the second end of the nanotrack. In one example, the charge current Ic is passed along the Y axis and the skyrmions will move along the Y axis. The skyrmion move along the Y axis, due to the spin orbit torque resulting from polarized electrons accumulated about the ferromagnet-heavy metal layer interface when the charge current flows in the heavy metal layer. Further, the skyrmions are confined to the nanotracks due to edge repulsion. In one example, the skyrmions have a tendency to be biased to shift along the −X direction, as they move towards the second end of the nanotrack, along the Y direction. Further details about the selective movement of the nucleated skyrmions along the nanotracks will now be described with reference to FIGS. 2B to 2H.

Figure 2A:
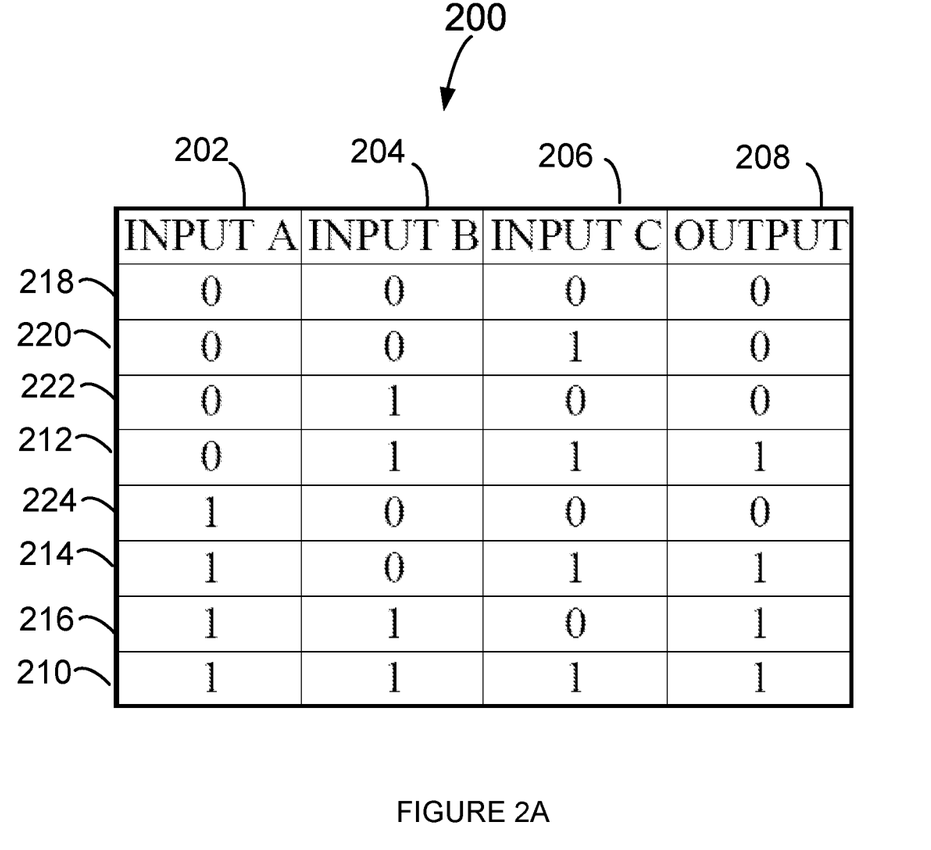
FIG. 2A shows an example truth table for a three input logic device, according to one aspect of the present disclosure.

FIG. 2A shows an example truth table 200 for a three input logic device, according to an example of this disclosure. Referring now to table 200, Input A is shown in column 202, input B is shown in column 204, input C is shown in column 206, and output is shown in column 208. For example, referring to row 210, when all the inputs A, B, and C are 1, the output is 1. Similarly, referring to rows 212, 214 and 216, if two of the inputs are a 1, the output is a 1. Similarly, referring to rows 218, 220, 222, and 224, when two or more of the inputs are a zero, output is a 0. As previously described, presence of a skyrmion at the input is indicative of a value of 1 and absence of a skyrmion at the input is indicative of a value of 0. Further, presence of a skyrmion at the output is indicative of a value of 1 and absence of a skyrmion at the output is indicative of a value of 0. Now, referring to FIGS. 2B to 2H, selective movement of the skyrmion from the first end of the nanotrack to the second end of the nanotrack is now described, for various combinations of input values.

Figure 2B:
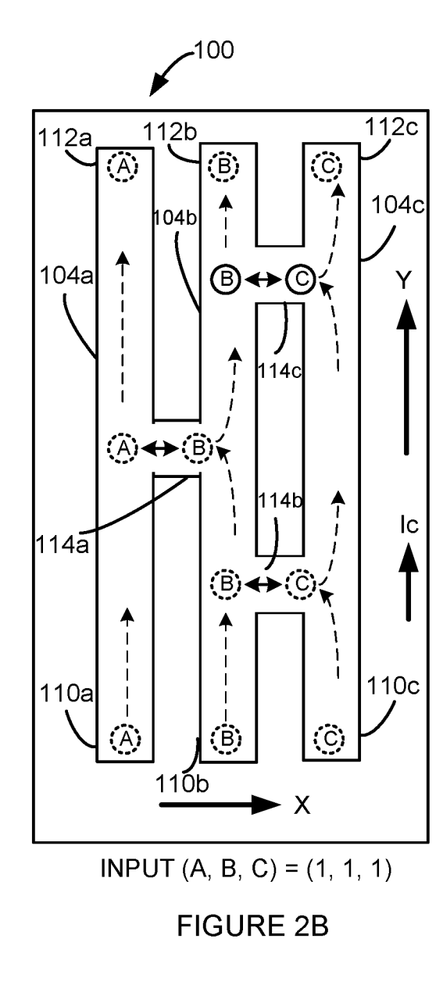
FIGS. 2B to 2H show selective movement of the skyrmion from the first end of the nanotrack to the second end of the nanotrack, for various combinations of input values shown in the truth table of FIG. 2A, according to one aspect of the present disclosure.

Now, referring to FIG. 2B, logic device 100 is shown with input values A, B, C set as 1, 1, 1 respectively, at the first end of the nanotracks. As previously described, a skyrmion is selectively nucleated at inputs A, B, and C. Nucleated skyrmion at input A, B and C are shown as skyrmion A, skyrmion B, and skyrmion C. When charge current Ic is passed in the +Y direction, the skyrmions will move towards the second end of the nanotracks, along the Y axis. As previously described, the skyrmions have a tendency to be biased to move in the −X direction, as they move towards the second end of the nanotrack.

As skyrmion B and skyrmion C moves towards the second end, they both approached the lower middle connector nanotrack 114*b*. As skyrmion C is biased to move towards the middle nanotrack 104*b*, skyrmion C tries to move from the right nanotrack 104*c* towards the middle nanotrack 104*b*, via the lower middle connector nanotrack 114*b*. However, the skyrmion B repels the skyrmion C and skyrmion C continues to move towards the second end 112*c* of the right nanotrack 104*c*.

As skyrmion A and skyrmion B move towards the second end, they both approach the middle connector nanotrack 114*a*. As skyrmion B is biased to move towards the left nanotrack 104*a*, skyrmion B tries to move from the middle nanotrack 104*b* towards the left nanotrack 104*a*, via the middle connector nanotrack 114*a*. However, the skyrmion A repels the skyrmion B and skyrmion B continues to move towards the second end 112*b* of the middle nanotrack 104*b*.

As skyrmion B and skyrmion C moves towards the second end, they both approached the upper middle connector nanotrack 114*c*. As skyrmion C is biased to move towards the middle nanotrack 104*b*, skyrmion C tries to move from the right nanotrack 104*c* towards the middle nanotrack 104*b*, via the upper middle connector nanotrack 114*c*. However, the skyrmion B repels the skyrmion C and skyrmion C continues to move towards the second end 112*c* of the right nanotrack 104*c*. Eventually skyrmion A, skyrmion B, and skyrmion C reach the second end of the nanotracks.

As previously described, the output is measured by the sensor disposed about the second end 112*b* of the middle nanotrack 104*b*. In this example, we notice that the skyrmion B is now disposed at the second end 112*b* of the middle nanotrack 104*b*. As there is a skyrmion present at the second end 112*b* of the middle nanotrack 104*b*, the sensor will detect the presence of the skyrmion and yield a value of 1. This result is consistent with the result expected according to row 210 of the truth table 200 of FIG. 2A.

Figure 2C:
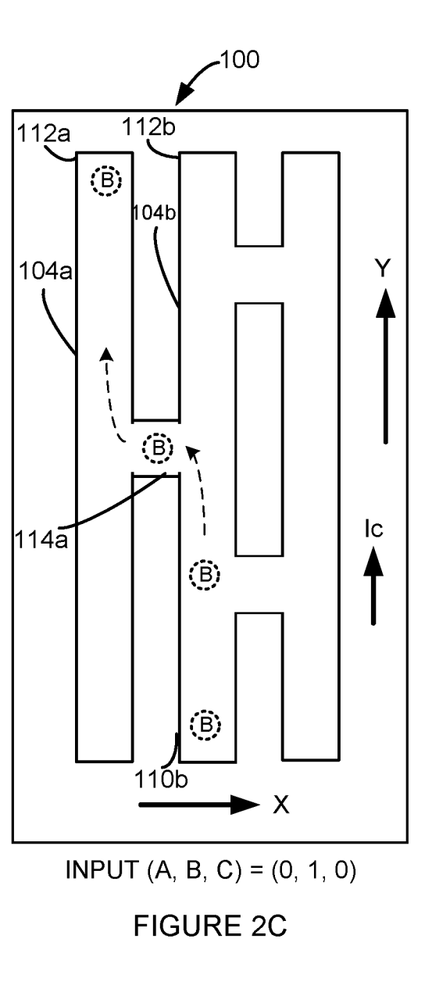

Now, referring to FIG. 2C, logic device 100 is shown with input values A, B, C set as 0, 1, 0 respectively, at the first end of the nanotracks. As previously described, a skyrmion is selectively nucleated at input B. Nucleated skyrmion at input B is shown as skyrmion B. When charge current Ic is passed in the +Y direction, the skyrmion B will move towards the second end 112*b* of the middle nanotrack 104*b*, along the Y axis. As previously described, the skyrmions have a tendency to be biased to move in the −X direction, as they move towards the second end of the nanotrack.

As skyrmion B moves towards the second end, it approached the middle connector nanotrack 114*a*. As skyrmion B is biased to move towards the left nanotrack, skyrmion B move from the middle nanotrack 104*b* towards the left nanotrack 104*a*, via the middle connector nanotrack 114*a*. As input A is zero, no corresponding skyrmion is moving in the left nanotrack 104*a*. Therefore, skyrmion B will shift from middle nanotrack 104*b* to left nanotrack 104*a* through the middle connector nanotrack 114*a* and continues to move towards the second end 112*a* of the left nanotrack 104*a* and eventually reach the second end 112*a* of the left nanotrack 104*a*.

As previously described, the output is measured by the sensor disposed about the second end 112*b* of the middle nanotrack 104*b*. In this example, we notice that the skyrmion B is now disposed at the second end 112*a* of the left nanotrack 104*a*. As there is no skyrmion present at the second end 112*b* of the middle nanotrack 104*b*, the sensor will detect the absence of the skyrmion and yield a value of 0. This result is consistent with the result expected according to row 222 of the truth table 200 of FIG. 2A.

Figure 2D:
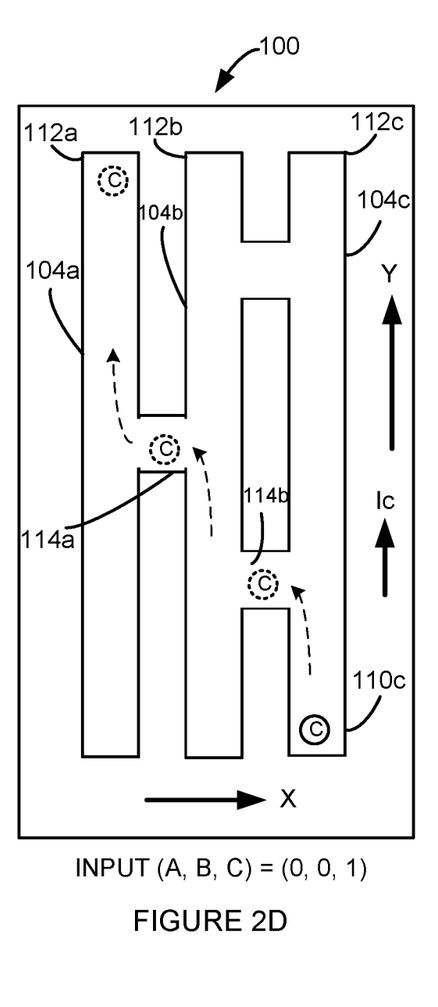

Now, referring to FIG. 2D, logic device 100 is shown with input values A, B, C set as 0, 0, 1 respectively, at the first end of the nanotracks. As previously described, a skyrmion is selectively nucleated at input C. Nucleated skyrmion at input C is shown as skyrmion C. When charge current Ic is passed in the +Y direction, the skyrmion C will move towards the second end 112*c* of the right nanotrack 104*c*, along the Y axis. As previously described, the skyrmions have a tendency to be biased to move in the −X direction, as they move towards the second end of the nanotrack.

As skyrmion C moves towards the second end, it approached the lower middle connector nanotrack 114*b*. As skyrmion C is biased to move towards the middle nanotrack, skyrmion C moves from the right nanotrack 104*c* towards the middle nanotrack 104*b*, via the lower middle connector nanotrack 114*b*. As input B is zero, no corresponding skyrmion is moving in the middle nanotrack 104*b*. Therefore, skyrmion C will shift from left nanotrack 104*c* to middle nanotrack 104*b* through the lower middle connector nanotrack 114*b* and continues to move towards the second end 112*b* of the middle nanotrack 104*b*.

As skyrmion C moves towards the second end 112*b* of the middle nanotrack 104*b*, it approached the middle connector nanotrack 114*a*. As skyrmion C is biased to move towards the left nanotrack, skyrmion C moves from the middle nanotrack 104*b* towards the left nanotrack 104*a*, via the middle connector nanotrack 114*a*. As input A is zero, no corresponding skyrmion is moving in the left nanotrack 104*a*. Therefore, skyrmion C will shift from middle nanotrack 104*b* to left nanotrack 104*a* through the middle connector nanotrack 114*a* and continues to move towards the second end 112*a* of the left nanotrack 104*a* and eventually reach the second end 112*a* of the left nanotrack 104*a*.

As previously described, the output is measured by the sensor disposed about the second end 112*b* of the middle nanotrack 104*b*. In this example, we notice that the skyrmion C is now disposed at the second end 112*a* of the left nanotrack 104*a*. As there is no skyrmion present at the second end 112*b* of the middle nanotrack 104*b*, the sensor will detect the absence of the skyrmion and yield an output value of 0. This result is consistent with the result expected according to row 220 of the truth table 200 of FIG. 2A.

Figure 2E:
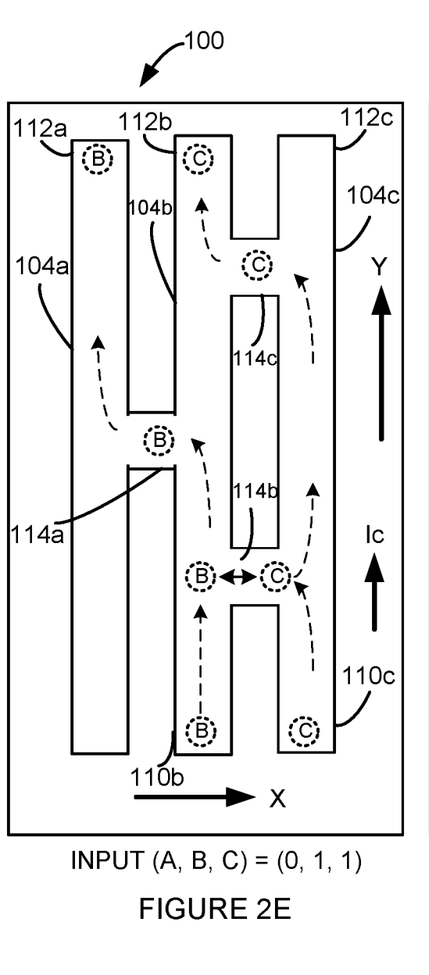

Now, referring to FIG. 2E, logic device 100 is shown with input values A, B, C set as 0, 1, 1 respectively, at the first end of the nanotracks. As previously described, a skyrmion is selectively nucleated at inputs A, B, and C. Nucleated skyrmion at input B and C are shown skyrmion B, and skyrmion C. No skyrmion is nucleated at input A. When charge current Ic is passed in the +Y direction, the skyrmions will move towards the second end of the nanotracks, along the Y axis. As previously described, the skyrmions have a tendency to be biased to move in the −X direction, as they move towards the second end of the nanotrack.

As skyrmion B and skyrmion C moves towards the second end, they both approached the lower middle connector nanotrack 114*b*. As skyrmion C is biased to move towards the middle nanotrack 104*b*, skyrmion C tries to move from the right nanotrack 104*c* towards the middle nanotrack 104*b*, via the lower middle connector nanotrack 114*b*. However, the skyrmion B repels the skyrmion C and skyrmion C continues to move towards the second end 112*c* of the right nanotrack 104*c*.

As skyrmion B move towards the second end, it approaches the middle connector nanotrack 114a. As skyrmion B is biased to move towards the left nanotrack 104a, skyrmion B tries to move from the middle nanotrack 104b towards the left nanotrack 104a, via the middle connector nanotrack 114a. As input A is zero, no corresponding skyrmion is moving in the left nanotrack 104a. Therefore, skyrmion B will shift from middle nanotrack 104b to left nanotrack 104a through the middle connector nanotrack 114a and continues to move towards the second end 112a of the left nanotrack 104a and eventually reach the second end 112a of the left nanotrack 104a. As skyrmion C moves towards the second end in the right nanotrack 104c, it approaches the upper middle connector nanotrack 114c. As skyrmion C is biased to move towards the middle nanotrack 104b, skyrmion C tries to move from the right nanotrack 104c towards the middle nanotrack 104b, via the upper middle connector nanotrack 114c. As skyrmion B has already shifter to left nanotrack 104a, skyrmion C will shift from right nanotrack 104c to middle nanotrack 104b through the upper middle connector nanotrack 114c and continues to move towards the second end 112b of the middle nanotrack 104b and eventually reach the second end 112b of the middle nanotrack 104b.

As previously described, the output is measured by the sensor disposed about the second end 112b of the middle nanotrack 104b. In this example, we notice that the skyrmion C is now disposed at the second end 112b of the middle nanotrack 104b. As there is a skyrmion present at the second end 112b of the middle nanotrack 104b, the sensor will detect the presence of the skyrmion and yield a value of 1. This result is consistent with the result expected according to row 212 of the truth table 200 of FIG. 2A.

Figure 2F:
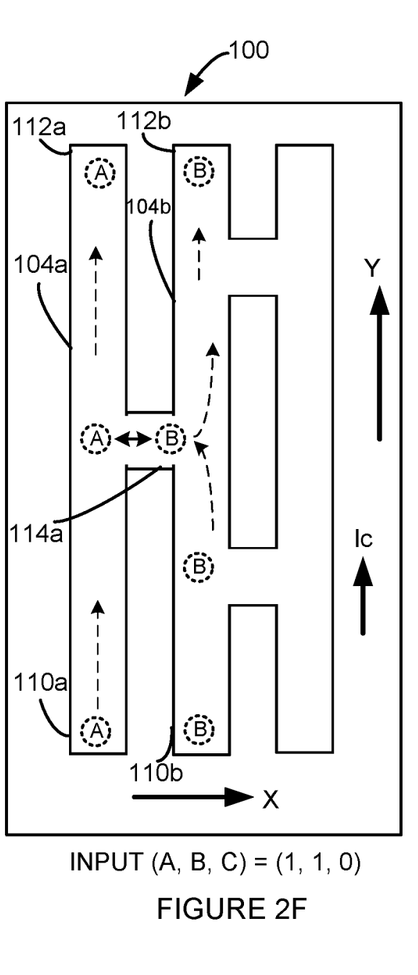

Now, referring to FIG. 2F, logic device 100 is shown with input values A, B, C set as 1, 1, 0 respectively, at the first end of the nanotracks. As previously described, a skyrmion is selectively nucleated at inputs A, B, and C. Nucleated skyrmion at input A, and B are shown as skyrmion A, and skyrmion B. No skyrmion is present at input C, as input C value is 0. When charge current Ic is passed in the +Y direction, the skyrmions will move towards the second end of the nanotracks, along the Y axis. As previously described, the skyrmions have a tendency to be biased to move in the −X direction, as they move towards the second end of the nanotrack.

As skyrmion A and skyrmion B move towards the second end, they both approach the middle connector nanotrack 114a. As skyrmion B is biased to move towards the left nanotrack 104a, skyrmion B tries to move from the middle nanotrack 104b towards the left nanotrack 104a, via the middle connector nanotrack 114a. However, the skyrmion A repels the skyrmion B and skyrmion B continues to move towards the second end 112b of the middle nanotrack 104b. Eventually, skyrmion A and skyrmion B reach the second end of the nanotracks.

As previously described, the output is measured by the sensor disposed about the second end 112b of the middle nanotrack 104b. In this example, we notice that the skyrmion B is now disposed at the second end 112b of the middle nanotrack 104b. As a skyrmion is present at the second end 112b of the middle nanotrack 104b, the sensor will detect the presence of the skyrmion and yield a value of 1. This result is consistent with the result expected according to row 216 of the truth table 200 of FIG. 2A.

Figure 2G:
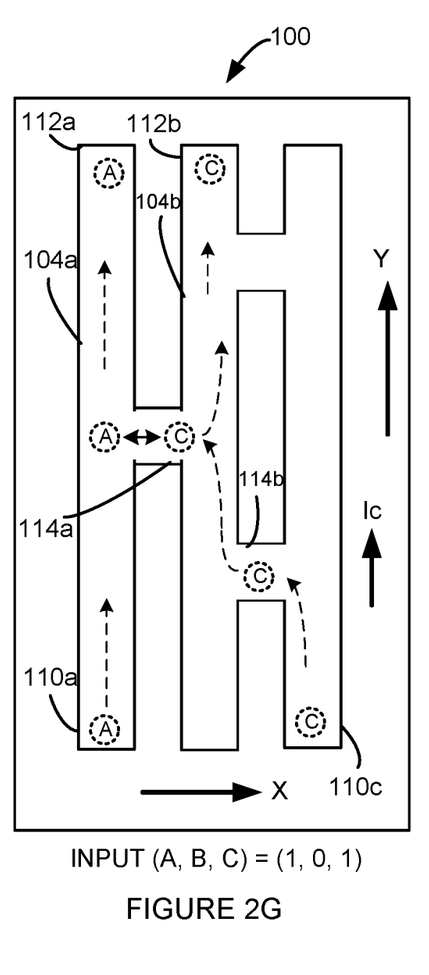

Now, referring to FIG. 2G, logic device 100 is shown with input values A, B, C set as 1, 0, 1 respectively, at the first end of the nanotracks. As previously described, a skyrmion is selectively nucleated at inputs A, B, and C. Nucleated skyrmion at input A, and C are shown as skyrmion A, and skyrmion C. No skyrmion is present at input B, as input B value is 0 in this example. When charge current Ic is passed in the +Y direction, the skyrmions will move towards the second end of the nanotracks, along the Y axis. As previously described, the skyrmions have a tendency to be biased to move in the −X direction, as they move towards the second end of the nanotrack.

As skyrmion C moves towards the second end, it approaches the lower middle connector nanotrack 114b. As skyrmion C is biased to move towards the middle nanotrack 104b, skyrmion C tries to move from the right nanotrack 104c towards the middle nanotrack 104b, via the lower middle connector nanotrack 114b. As there is no skyrmion B in this example, skyrmion C continues to move through the lower middle connector 114b and shifts into the middle nanotrack 104b. Skyrmion C continues to move towards the second end 112b of the middle nanotrack 104b.

As skyrmion A and skyrmion C move towards the second end, they both approach the middle connector nanotrack 114a. As skyrmion C is biased to move towards the left nanotrack 104a, skyrmion C tries to move from the middle nanotrack 104b towards the left nanotrack 104a, via the middle connector nanotrack 114a. However, the skyrmion A repels the skyrmion C and skyrmion C continues to move towards the second end 112b of the middle nanotrack 104b. Eventually, skyrmion A, and skyrmion C reach the second end of the nanotracks.

As previously described, the output is measured by the sensor disposed about the second end 112b of the middle nanotrack 104b. In this example, we notice that the skyrmion C is now disposed at the second end 112b of the middle nanotrack 104b. As there a skyrmion present at the second end 112b of the middle nanotrack 104b, the sensor will detect the presence of the skyrmion and yield a value of 1. This result is consistent with the result expected according to row 214 of the truth table 200 of FIG. 2A.

Figure 2H:
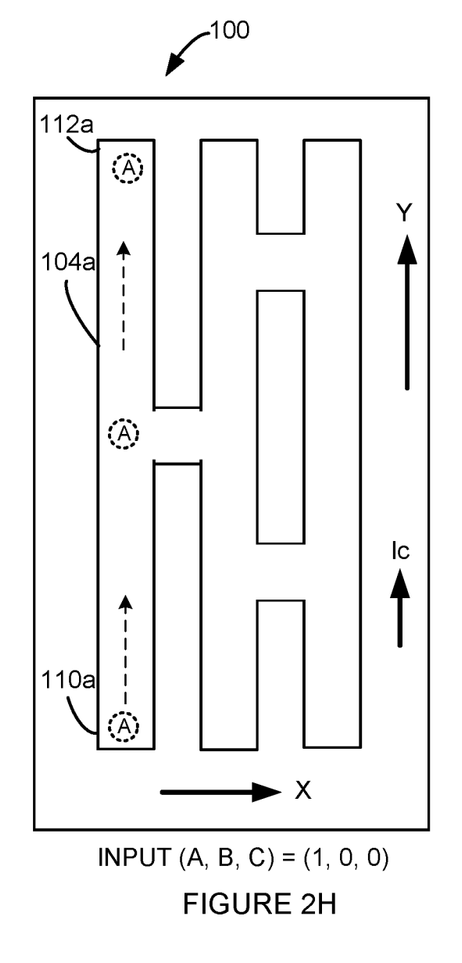

Now, referring to FIG. 2H, logic device 100 is shown with input values A, B, C set as 1, 0, 0 respectively, at the first end of the nanotracks. As previously described, a skyrmion is selectively nucleated at input A. Nucleated skyrmion at input A is shown as skyrmion A. No skyrmions are present at input B, and input C, as input B and input C values are 0 in this example. When charge current Ic is passed in the +Y direction, the skyrmions will move towards the second end of the nanotracks, along the Y axis. As previously described, the skyrmions have a tendency to be biased to move in the −X direction, as they move towards the second end of the nanotrack.

In this example, skyrmion A moves towards the second end. As skyrmion A is biased to move towards the −X direction, skyrmion A continues to move towards the second end of the left nanotrack 104a. Eventually, skyrmion A reaches the second end 112a of the left nanotrack 104a.

As previously described, the output is measured by the sensor disposed about the second end 112b of the middle nanotrack 104b. In this example, we notice that no skyrmion is disposed at the second end 112b of the middle nanotrack 104b. As no skyrmion is present at the second end 112b of the middle nanotrack 104b, the sensor will detect the absence of the skyrmion and yield a value of 0. This result is consistent with the result expected according to row 224 of the truth table 200 of FIG. 2A.

When the input values A, B, C are set as 0, 0, 0 respectively, at the first end of the nanotracks, no skyrmions are present at the first end of the nanotracks. When the charge current Ic is passed, there will be no skyrmions at the second end of the nanotracks. As no skyrmion is detected at the output, the sensor will detect the absence of the skyrmion and yield a value of 0. This result is consistent with the result expected according to row 218 of the truth table 200 of FIG. 2A.

Figure 3:
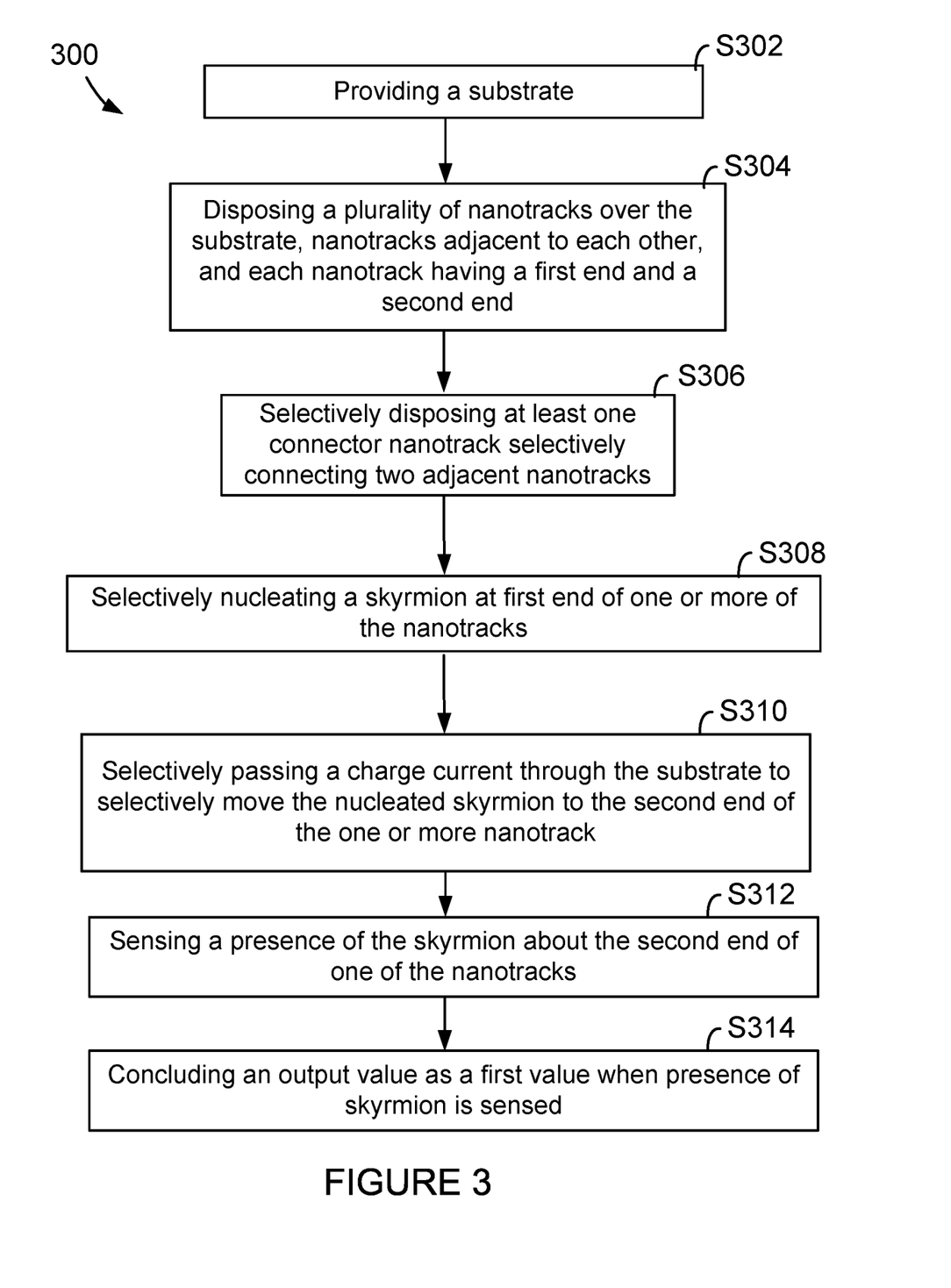
FIG. 3 shows an example flow diagram, according to one aspect of the present disclosure.

Now, referring to FIG. 3, an example flow diagram 300 is described. In block S302, a substrate is provided. For example, substrate 102 is provided.

In block S304, a plurality of nanotracks are disposed over the substrate, nanotracks adjacent to each other, with each nanotrack having a first end and a second end. For example, plurality of nanotracks 104a, 104b, and 104c are provided. Each nanotrack has a first end and a second end. For example, nanotrack 104a has a first end 110a and a second end 112a. The nanotrack 104b has a first end 110b and a second end 112b. The nanotrack 104c has a first end 110c and a second end 112c.

In block S306, at least one connector nanotrack is selectively disposed to connect two adjacent nanotracks. For example, A plurality of connector nanotracks 114a, 114b, and 114c are selectively disposed between two adjacent nanotracks. For example, connector nanotrack 114a (sometimes referred to as middle connector nanotrack 114a) is disposed between the left nanotrack 104a and middle nanotrack 104b. Connector nanotrack 114b (sometimes referred to as lower middle nanotrack 114b) is disposed between the middle nanotrack 104a and right nanotrack 104c below the middle connector nanotrack 114a. Connector nanotrack 114c (sometimes referred to as upper middle nanotrack 114c) is disposed between the middle nanotrack 104a and right nanotrack 104c above the middle connector nanotrack 114a.

In block S308, a skyrmion is selectively nucleated at the first end of one or more of the nanotracks. Various combinations of selectively nucleating one or more skyrmions was previously described with reference to FIGS. 2B-2H. For example, referring to FIG. 2B, logic device 100 was shown with input values A, B, C set as 1, 1, 1 respectively, at the first end of the nanotracks. As previously described, a skyrmion is selectively nucleated at inputs A, B, and C. Nucleated skyrmion at input A, B and C are shown as skyrmion A, skyrmion B, and skyrmion C. When charge current Ic is passed in the +Y direction, the skyrmions will move towards the second end of the nanotracks, along the Y axis.

In block S310, a charge current is selectively passed through the substrate to selectively move the nucleated skyrmion to the second end of one or more nanotracks. As previously described with reference to FIGS. 2B-2H, when charge current Ic is passed in the +Y direction, the skyrmions will move towards the second end of the nanotracks, along the Y axis.

In block S312, a presence of the skyrmion is sensed about the second end of the nanotrack. For example, presence of the skyrmion is sensed about the second end of the middle nanotrack 104b.

In block S314, concluding an output value as a first value, when the presence of the skyrmion is sensed. For example, presence of the skyrmion about the seconde nd of the middle nanotrack 104b is indicative of an output of first value.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that phraseology or terminology employed herein is for the purpose of description and not of limitation.

While embodiments of the present invention are described above with respect to what is currently considered its preferred embodiments, it is to be understood that the invention is not limited to that described above. To the contrary, the invention is intended to cover various modifications and equivalent arrangements within the spirit and scope of the appended claims.

What is claimed is:

1. A system, including:
   a substrate;
   a plurality of nanotracks disposed along a first axis, with at least a left nanotrack, a right nanotrack and a middle nanotrack over the substrate, the middle nanotrack disposed between the left nanotrack and the right nanotrack, each nanotrack having a first end and a second end;
   at least one connector nanotrack is disposed to selectively connect two adjacent nanotracks;
   an input value is defined at the first end of the plurality of nanotracks by selectively nucleating a skyrmion at first end of one or more of the nanotracks, wherein presence of the skyrmion indicative of a first value and absence of the skyrmion indictive of a second value;
   a charge current is selectively passed through the substrate to selectively move the nucleated skyrmion towards the second end of the one or more nanotrack, charge current passed along the first axis;
   the presence of the skyrmion is sensed about the second end of the middle nanotrack; and
   an output value is concluded as the first value when the presence of the skyrmion is sensed.

2. The system of claim 1, wherein, at least one skyrmion in one of the nanotrack moves to an adjacent nanotrack, via the at least one connector nanotrack.

3. The system of claim 1, wherein, the charge current is passed through the substrate in a first direction, the nucleated skyrmion selectively moves in the first direction due to a spin orbit torque generated in a second direction orthogonal to the first direction.

4. The system of claim 1, further including,
   at least one nucleating device is selectively disposed adjacent the first end of the nanotracks; and
   the nucleating device is selectively energized to selectively nucleate skyrmion in one or more nanotrack to indicate the input value.

5. The system of claim 1, further including,
   at least one sensing device is selectively disposed adjacent the second end of the middle nanotrack to selectively sense the presence of the skyrmion about the second end of the middle nanotrack.

6. The system of claim 1, wherein, at least one left connector nanotrack is disposed between the left nanotrack and the middle nanotrack; and
   at least two right connector nanotracks is disposed between the middle nanotrack and the right nanotrack.

7. The system of claim 6, wherein,
   the left connector nanotrack is selectively disposed about a middle portion of the left connector nanotrack;
   one of the right connector track is selectively disposed below the left connector nanotrack; and
   one of the other right connector track is selectively disposed above the left connector nanotrack.

8. The system of claim 1, wherein the skyrmion selectively moves from the first end to the second end of one of the nanotrack and selectively shifts to an adjacent nanotrack through one of the connector track, unless another skyrmion is positioned in the adjacent track about the one of the connector track.

9. The system of claim 8, wherein the movement of the skyrmion is biased to move towards the left nanotrack.

10. A method, including:
proving a substrate;
disposing a plurality of nanotracks along a first axis, with at least a left nanotrack, a right nanotrack and a middle nanotrack over the substrate, the middle nanotrack disposed between the left nanotrack and the right nanotrack, each nanotrack having a first end and a second end;
disposing at least one connector nanotrack selectively connecting two adjacent nanotracks;
selectively defining an input value at the first end of the plurality of nanotracks by selectively nucleating a skyrmion at first end of one or more of the nanotracks, wherein presence of the skyrmion indicative of a first value and absence of the skyrmion indictive of a second value;
selectively passing a charge current through the substrate to selectively move the nucleated skyrmion towards the second end of the one or more nanotrack, charge current passed along the first axis;
sensing the presence of the skyrmion about the second end of the middle nanotrack; and
concluding an output value as the first value when the presence of the skyrmion is sensed.

11. The method of claim 10, wherein, at least one skyrmion in one of the nanotrack moves to an adjacent nanotrack, via the at least one connector nanotrack.

12. The method of claim 10, wherein, the charge current is passed through the substrate in a first direction, the nucleated skyrmion selectively moves in the first direction due to a spin orbit torque generated in a second direction orthogonal to the first direction.

13. The method of claim 10, further including,
selectively disposing at least one nucleating device adjacent the first end of the nanotracks; and
selectively energizing the nucleating device to selectively nucleate skyrmion in one or more nanotrack to indicate the input value.

14. The method of claim 10, further including,
selectively disposing at least one sensing device adjacent the second end of the middle nanotrack to selectively sense the presence of the skyrmion about the second end of the middle nanotrack.

15. The method of claim 10, further including, disposing at least one left connector nanotrack between the left nanotrack and the middle nanotrack; and
disposing at least two right connector nanotracks between the middle nanotrack and the right nanotrack.

16. The method of claim 15, further including,
selectively disposing the left connector nanotrack about a middle portion of the left connector nanotrack;
selectively disposing one of the right connector track below the left connector nanotrack; and
selectively disposing one of the other right connector track above the left connector nanotrack.

17. The method of claim 10, wherein the skyrmion selectively moving from the first end to the second end of one of the nanotrack selectively shifts to an adjacent nanotrack through one of the connector track, unless another skyrmion is positioned in the adjacent track about the one of the connector track.

18. The method of claim 17, wherein the movement of the skyrmion is biased to move towards the left nanotrack.

* * * * *